(12) United States Patent
Iwasaki

(10) Patent No.: US 9,548,230 B2
(45) Date of Patent: Jan. 17, 2017

(54) TEMPORARY STORAGE DEVICE, TRANSPORT SYSTEM, AND TEMPORARY STORAGE METHOD

(71) Applicant: MURATA MACHINERY, LTD., Kyoto-shi, Kyoto (JP)

(72) Inventor: Junji Iwasaki, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 0 days.

(21) Appl. No.: 14/859,488

(22) Filed: Sep. 21, 2015

(65) Prior Publication Data

US 2016/0090239 A1 Mar. 31, 2016

(30) Foreign Application Priority Data

Sep. 25, 2014 (JP) ................. 2014-195153

(51) Int. Cl.
*B65G 1/00* (2006.01)
*H01L 21/677* (2006.01)

(52) U.S. Cl.
CPC ..... *H01L 21/6773* (2013.01); *H01L 21/67727* (2013.01); *H01L 21/67733* (2013.01); *H01L 21/67736* (2013.01)

(58) Field of Classification Search
CPC ................. H01L 21/67733; B65G 1/0464
USPC .................................................. 414/281
See application file for complete search history.

(56) References Cited

U.S. PATENT DOCUMENTS

| 8,047,762 | B2* | 11/2011 | Zimmerhackl ... H01L 21/67276 414/222.07 |
| 8,206,077 | B2* | 6/2012 | Ishikawa ................ B65G 37/02 212/332 |
| 8,915,690 | B2* | 12/2014 | Ota .................... H01L 21/67733 414/275 |
| 9,004,840 | B2* | 4/2015 | Kinugawa ......... H01L 21/67733 414/281 |
| 9,263,311 | B2* | 2/2016 | Ota ...................... B65G 1/0457 |
| 2004/0109746 | A1* | 6/2004 | Suzuki ............. H01L 21/67727 414/373 |
| 2004/0126208 | A1* | 7/2004 | Tawyer ............. H01L 21/67769 414/222.02 |
| 2006/0051192 | A1* | 3/2006 | Fujiki .................... B65G 37/02 414/626 |
| 2006/0182553 | A1* | 8/2006 | Yamamoto ......... B65G 47/5104 414/278 |

(Continued)

*Primary Examiner* — Kaitlin Joerger
(74) *Attorney, Agent, or Firm* — Keating & Bennett, LLP

(57) ABSTRACT

A temporary storage device transfers an article in different positions to and from an overhead travelling vehicle system and a second transport system, and transfers an article to and from an article transfer position outside the temporary storage device. The temporary storage device includes a local carrier including a hoist, travel rails of the local carrier below a travel rail of the overhead travelling vehicle system, passing directly above an article transfer position, and a slide rack below the travel rails of the local carrier, slidable between a portion directly above the transfer position and a second position in which an article can be transferred to and from the second transport system, the second position being different from the portion directly above the transfer position in a direction perpendicular or substantially perpendicular to the travel rails of the local carrier in a horizontal plane.

6 Claims, 13 Drawing Sheets

(56) References Cited

U.S. PATENT DOCUMENTS

| | | | | |
|---|---|---|---|---|
| 2007/0224026 A1* | 9/2007 | Chang | ............... | H01L 21/67706 414/626 |
| 2012/0275886 A1 | 11/2012 | Ota | | |
| 2015/0110585 A1* | 4/2015 | Ota | ................... | H01L 21/67733 414/222.13 |
| 2015/0197400 A1* | 7/2015 | Kinugawa | ......... | H01L 21/67379 414/458 |
| 2015/0203333 A1* | 7/2015 | Ota | ................... | H01L 21/67288 212/276 |
| 2015/0329298 A1* | 11/2015 | Ito | ........................ | B65G 63/042 414/222.07 |

* cited by examiner

TEMPORARY STORAGE DEVICE, TRANSPORT SYSTEM, AND TEMPORARY STORAGE METHOD

BACKGROUND OF THE INVENTION

1. Field of the Invention

The present invention relates to a temporary storage device and a temporary storage method for temporarily storing articles between a plurality of transport systems, and a transport system using the temporary storage device.

2. Description of the Related Art

In semiconductor factories, cassettes housing semiconductor wafers are transported by an overhead travelling vehicle system between load ports of processing devices. The applicant has proposed providing, as a temporary storage device between an overhead travelling vehicle system and a load port, a local carrier, travel rails of the local carrier, and a buffer, between the load port and a travel rail of the overhead travelling vehicle (See, for example, JP 5229363 B2). In this device, a cassette can vertically pass between the travel rails of the local carrier, and the buffer is provided below the travel rails of the local carrier so that the overhead travelling vehicle and the local carrier can both access the buffer. Therefore, the overhead travelling vehicle and the local carrier can both access the load port and the buffer.

Passing is sometimes required during transport. For example, it may be desired that a cassette containing express articles (a hot lot) is transported so as to pass a cassette containing normal articles. For this purpose, a transport system for hot lots may be provided in addition to a transport system for normal articles. However, it is further required that the transport system for normal articles and the transport system for hot lots can be connected to the same article transfer position.

SUMMARY OF THE INVENTION

Preferred embodiments of the present invention provide a temporary storage device capable of transferring an article in different positions to and from an overhead travelling vehicle system and a second transport system, and also capable of transferring an article to and from an article transfer position outside the temporary storage device.

A temporary storage device according to a preferred embodiment of the present invention is a device that temporarily stores an article between an overhead travelling vehicle system and an article transfer position, the temporary storage device including: a local carrier capable of travelling, the local carrier including a hoist to raise and lower an article; travel rails of the local carrier provided below a travel rail of the overhead travelling vehicle system so as to pass directly above the transfer position; and a slide rack provided below the travel rails of the local carrier, the slide rack being slidable between a portion directly above the transfer position and a second position in which an article is transferred to and from a second transport system including a transfer device, the second position being different from the portion directly above the transfer position in a direction perpendicular or substantially perpendicular to the travel rails of the local carrier in a horizontal plane.

A temporary storage method according to a preferred embodiment of the present invention is a method for temporarily storing an article between an overhead travelling vehicle system and an article transfer position, the method performed by a temporary storage device including: a local carrier capable of travelling, the local carrier including a hoist to raise and lower an article; travel rails of the local carrier provided below a travel rail of the overhead travelling vehicle system so as to pass directly above the transfer position; and a slide rack provided below the travel rails of the local carrier, and slidable between a portion directly above the transfer position and a second position in which an article is transferred to and from a second transport system including a transfer device, the second position being different from the portion directly above the transfer position in a direction perpendicular or substantially perpendicular to the travel rails of the local carrier in a horizontal plane, the method including the steps of: transferring an article by the local carrier between the transfer position and the slide rack; transferring an article between the slide rack located directly above the transfer position and the overhead travelling vehicle system; and transferring an article between the slide rack located in the second position and the second transport system.

According to various preferred embodiments of the present invention, the overhead travelling vehicle system and the local carrier is able to transfer an article to and from the slide rack located directly therebelow and the article transfer position, and the second transport system is able to transfer an article to and from the slide rack located in the second position. In other words, the overhead travelling vehicle system and the second transport system are able to transfer an article to and from the slide rack in different positions, and an article is able to be transferred by the local carrier between the slide rack and the article transfer position. Thus, the overhead travelling vehicle system and the second transport system are both able to transfer an article to and from the article transfer position. The article transfer position is, for example, a load port of a processing device, a stocker, a docking station of a working carrier, or the like. An overhead travelling vehicle is able to transfer an article to and from the article transfer position by a hoist. The position different from the portion directly above the transfer position in the direction perpendicular or substantially perpendicular to the travel rails in the horizontal plane is not intended to limit the slide rack to sliding perpendicularly to the travel rails, but means that the sliding changes the position along a direction perpendicular or substantially perpendicular to the travel rails. In the specification, description about the temporary storage device directly applies to the temporary storage method.

A transport system according to a preferred embodiment of the present invention includes the above-described temporary storage device, a first overhead travelling vehicle system, which is the overhead travelling vehicle system, with a travel rail passing directly above the transfer position, and a second overhead travelling vehicle system, which is the second transport system, with a travel rail passing above the second position.

With this configuration,
the first overhead travelling vehicle system and the local carrier are able to transfer and receive an article to and from the slide rack located directly therebelow and the article transfer position, and
the second overhead travelling vehicle system is able to transfer and receive an article to and from the slide rack located in the second position. Thus, the first overhead travelling vehicle system and the second overhead travelling vehicle system are both able to transfer an article to and from the article transfer position via the different positions of the slide rack.

Preferably, the transfer position is a load port of a processing device, and the second overhead travelling vehicle system is configured to transport an article with a production-control attribute different from that of the first overhead travelling vehicle system. In this manner, by sliding the slide rack to the second position, the article with a different production-control attribute such as a hot lot or a lot for process control is able to be transferred promptly between the load port and the second overhead travelling vehicle system. Moreover, the slide rack having slid to the second position does not interfere with transfer between the first overhead travelling vehicle system and the local carrier and the load port, and thus does not block transport of a normal article.

A transport system according to a preferred embodiment of the present invention includes the above-described temporary storage device provided in a bay of a semiconductor factory, a first overhead travelling vehicle system, which is the overhead travelling vehicle system, with a travel rail passing directly above the transfer position, the travel rail extending from inside the bay to an inter-bay route for inter-bay transport, the second transport system capable of transferring an article to and from the slide rack located in the second position and transporting an article in the bay, an overhead travelling vehicle system for inter-bay transport with a travel rail disposed in parallel or substantially in parallel with the travel rail of the first overhead travelling vehicle system in the inter-bay route, and a conveyor connecting a position below the overhead travelling vehicle system for inter-bay transport and the second transport system.

With this configuration, the overhead travelling vehicle system for inter-bay transport and the second transport system are able to be connected without providing a branching portion and a merging portion. Therefore, branching from and merging with the inter-bay route of the first overhead travelling vehicle system are not necessary, which results in no congestion involved in the branching and merging. Further, the travel rail is able to be installed in a simple layout. Since the conveyor passes below the overhead travelling vehicle system for inter-bay transport, an overhead travelling vehicle is able to transfer an article with a hoist (a lifting device and a lifting stage).

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described. The scope of the present invention shall be defined based on the claims, in consideration of the description of the specification and known techniques in this field, and according to the understanding of those skilled in the art.

Figure 1:
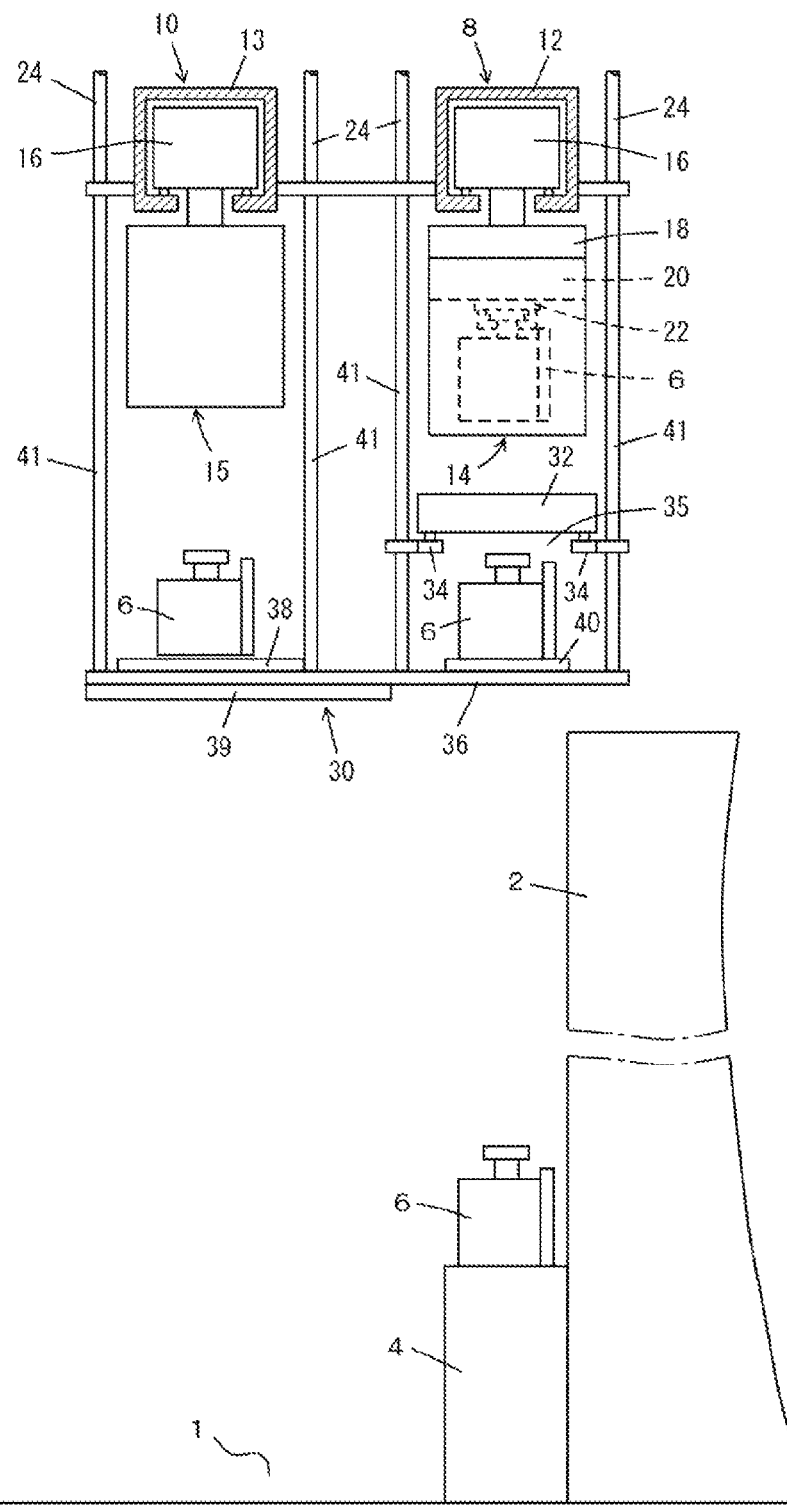
FIG. 1 is a front view with partially cutaway portions of a temporary storage device according to a preferred embodiment of the present invention, surrounding overhead travelling vehicle systems, and a processing device.
Figure 2:
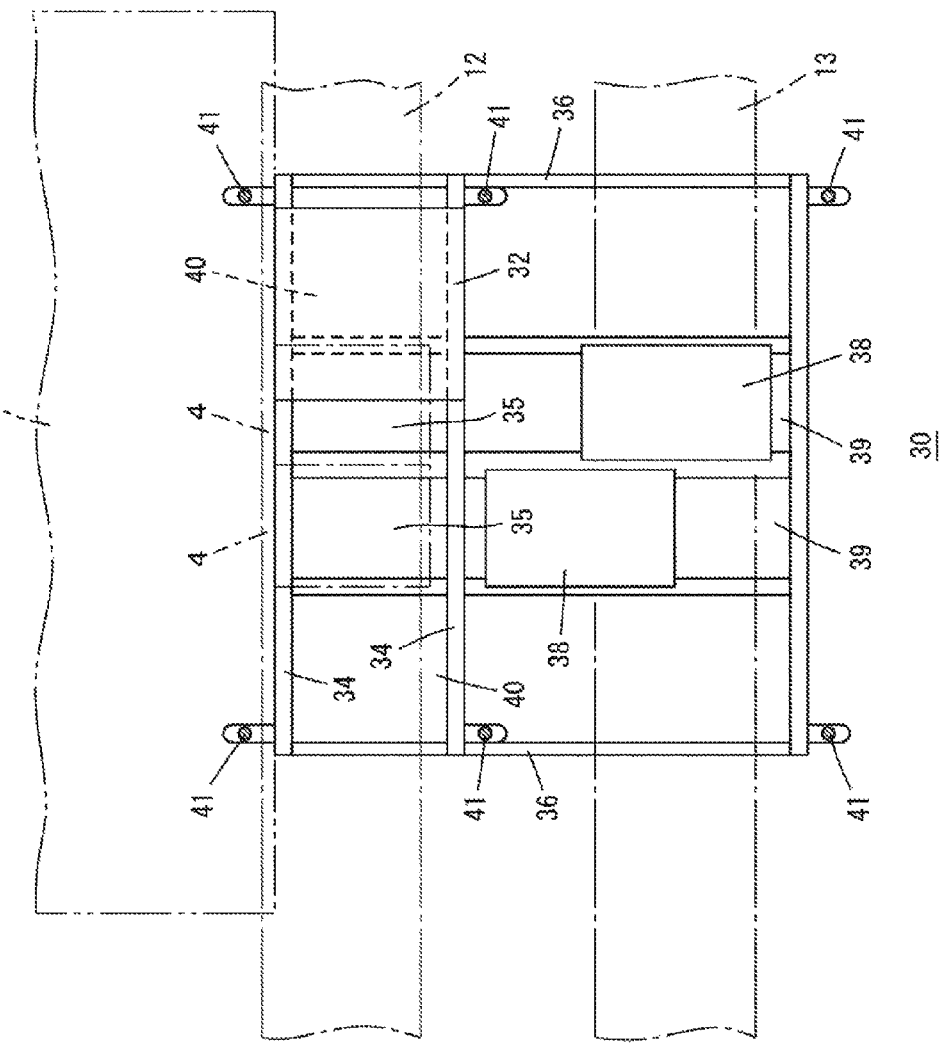
FIG. 2 is a plan view with partially cutaway portions of the temporary storage device according to a preferred embodiment of the present invention and the processing device.

FIGS. 1 to 7 illustrate a temporary storage device 30 according to a preferred embodiment of the present invention, and a temporary storage method and a transport system using the temporary storage method according to other preferred embodiments of the present invention. FIGS. 1 and 2 illustrate the temporary storage device 30, a surrounding processing device 2, and overhead travelling vehicle systems 8 and 10 in a bay 1 in a semiconductor factory. The processing device 2 includes a load port 4. The load port 4 is an example of a position to transfer a cassette 6. A stocker, a station to dock a working carrier, a location to place a vacant cassette, or the like may be the transfer position. The processing device 2 may be literally a processing device, an inspection device, or the like. The cassette 6 preferably is a FOUP or the like, and houses semiconductor wafers as products. The cassette 6 may be a cassette that houses wafers for process control, inspection, or the like, or a vacant cassette or the like. Articles to be transported are not limited to semiconductor wafers, and may be reticles for exposure of semiconductors, food products, medical and pharmaceutical products, or the like. In place of the cassette 6, a container such as a bucket may be used. Alternatively, an article may be chucked and transported directly, without a container, by an overhead travelling vehicle or the like.

A travel rail 12 of the overhead travelling vehicle system for normal articles (first overhead travelling vehicle system) 8 passes directly above the load port 4. In order to transport cassettes with a different production-control attribute, a travel rail 13 of the second overhead travelling vehicle system 10 is disposed in parallel with the travel rail 12. The first overhead travelling vehicle system 8 causes an overhead travelling vehicle 14 to travel, and the second overhead travelling vehicle system 10 causes an overhead travelling vehicle 15 to travel. The overhead travelling vehicles 14 and 15 may be physically the same. Reference numeral 16 denotes travelling portions. The travelling portions 16 travel along the travel rails 12 and 13, and support a transversely feeding device 18. The transversely feeding device 18 transversely moves a lifting device 20. The lifting device 20 raises and lowers a lifting stage 22 including a chuck. Reference numeral 24 denotes poles for the travel rails 12 and 13. The transversely feeding device 18 may be omitted.

The temporary storage device 30 is disposed at a height between the travel rails 12 and 13 and the load port 4. A local carrier 32 travels along a pair of travel rails 34 and 34. An opening 35, through which the cassette 6 can pass vertically, is provided between the pair of travel rails 34 and 34. A slide rack 38 is provided to be slidable between a position which is directly below the travel rail 12 of the first overhead travelling vehicle system 8 and the travel rails 34 and directly above the load port 4, and a position which is directly below the travel rail 13 of the second overhead travelling vehicle system 10. A sliding direction of the slide rack 38 is a direction perpendicular or substantially perpendicular to a travelling direction on the parallel or substantially parallel travel rails 12 and 13 in a horizontal plane. Reference numeral 39 denotes a fixed portion, which houses a slide mechanism of the slide rack 38 or the like. In addition to the slide rack 38, a fixed rack 40 may be provided. The temporary storage device 30 is supported by the overhead travelling vehicle systems 8 and 10 through the poles 41, for example.

Figure 3:
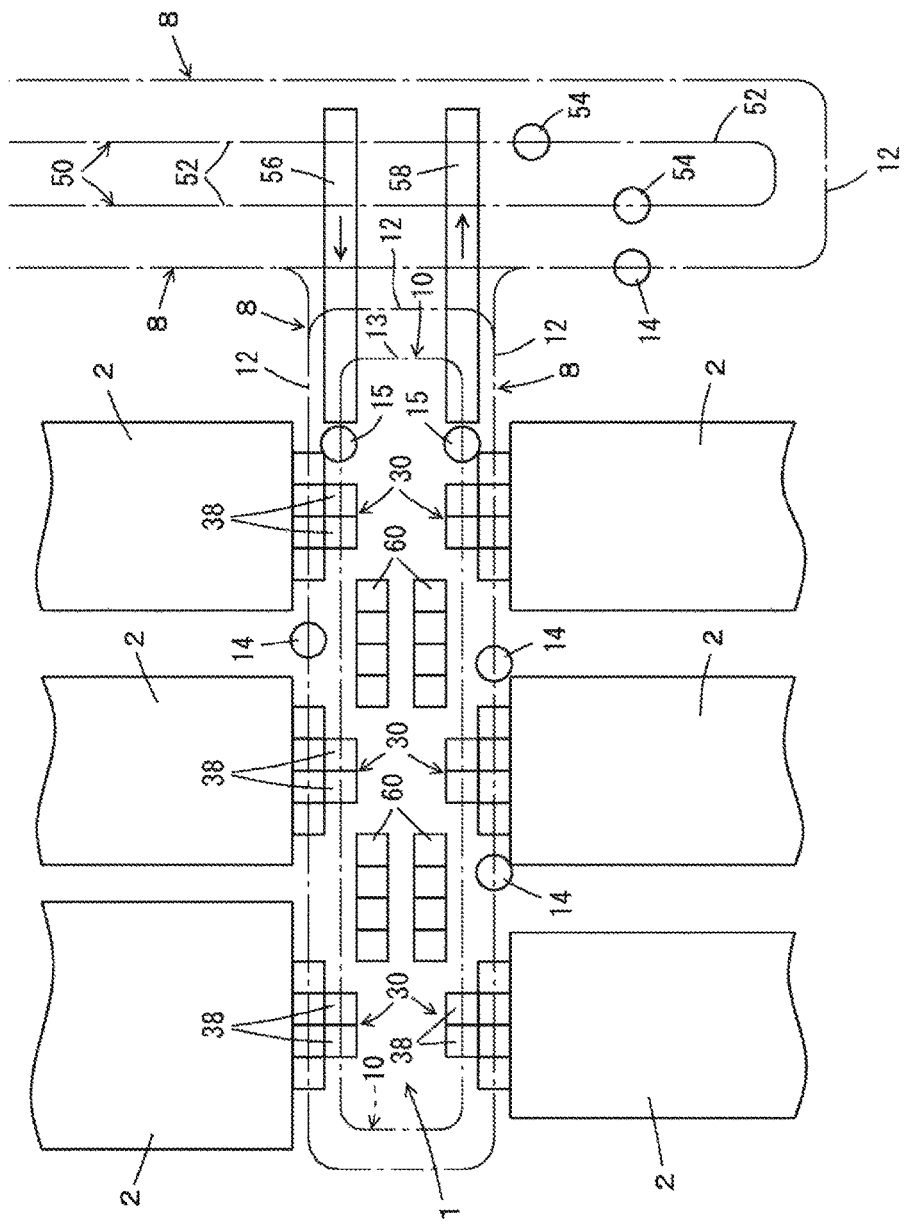
FIG. 3 is a plan view of a transport system including the temporary storage device according to a preferred embodiment of the present invention.
Figure 4:
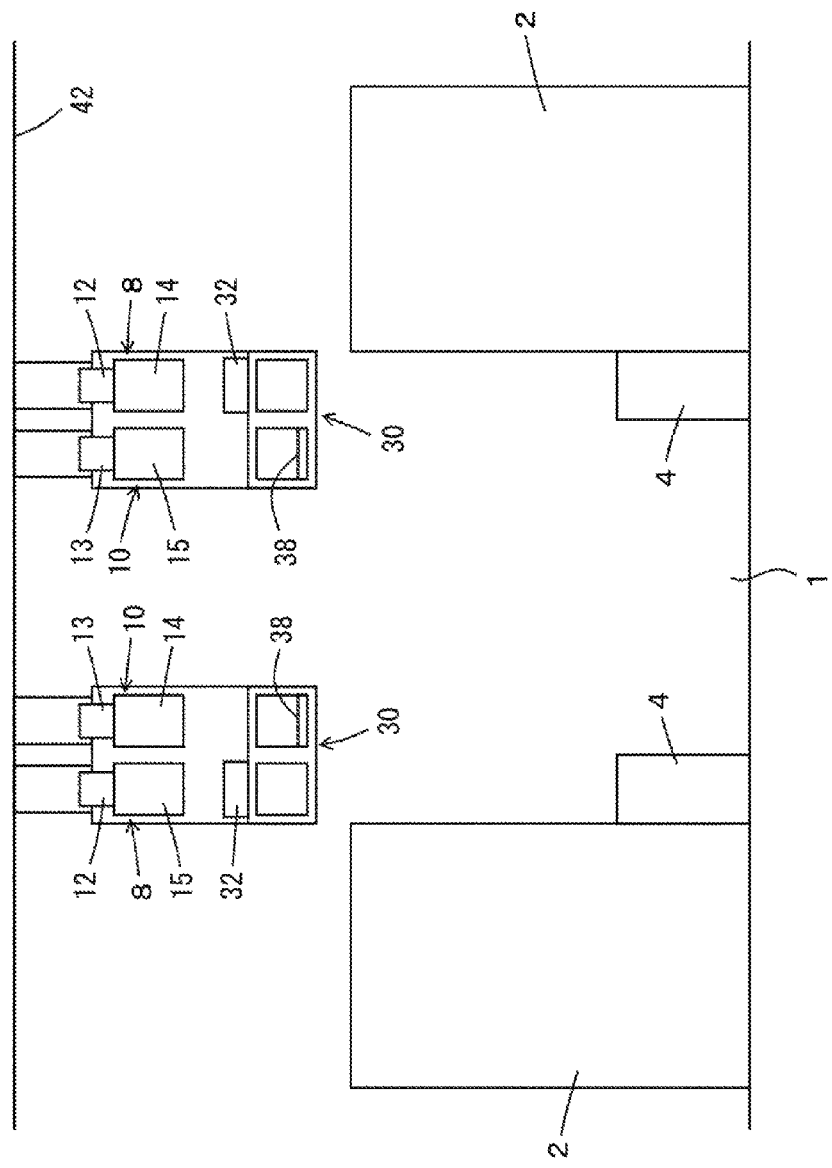
FIG. 4 is a front view of the transport system including the temporary storage device according to a preferred embodiment of the present invention.

FIGS. 3 and 4 illustrate the entire transport system using the temporary storage device 30. Temporary storage and transport in the bay 1 are performed as illustrated in FIGS. 1 and 2. For transport between bays (inter-bay transport), an overhead travelling vehicle system 50 is provided to an inter-bay route. A travel rail 52 of the overhead travelling vehicle system 50 is provided in parallel or substantially in parallel with the travel rail 12 in the first overhead travelling vehicle system 8. Reference numeral 54 denotes overhead travelling vehicles that travel in the overhead travelling vehicle system 50. The overhead travelling vehicles 54 may be physically the same as the overhead travelling vehicles 14 and 15.

Allowing the overhead travelling vehicles 15 and 54 to directly travel across the overhead travelling vehicle system 50 and the overhead travelling vehicle system 10 results in complicated branching and merging of the travel rails, which causes congestion. Therefore, the overhead travelling vehicle system 50 and the overhead travelling vehicle system 10 are connected by a pair of conveyors 56 and 58. The conveyor 56 provides transport from the overhead travelling vehicle system 50 in the inter-bay route to the overhead travelling vehicle system 10 in the bay 1, and the conveyor 58 provides transport from the overhead travelling vehicle system 10 in the bay 1 to the overhead travelling vehicle system 50 in the inter-bay route. In order to increase the buffer capacity in the bay 1, buffers 60 are provided so that the overhead travelling vehicles 15 are able to access the buffers 60. The buffers 60 may be omitted.

Transfer of an article (cassette 6) in the present preferred embodiment is performed as described below. When the overhead travelling vehicles 15 do not include a transversely feeding device, buffers are preferably provided below the travel rail 13.

Load port 4: the overhead travelling vehicle 14 and the local carrier 32

Slide rack 38: the overhead travelling vehicles 14 and 15 and the local carrier 32

Fixed rack 40: the overhead travelling vehicle 14 and the local carrier 32

Transfer between the overhead travelling vehicle systems 8 and 10: via the slide rack 38

Transfer between the overhead travelling vehicle systems 10 and 50: via the conveyors 56 and 58

Buffer 60: use a transversely feeding device of the overhead travelling vehicles 15

Figure 5:
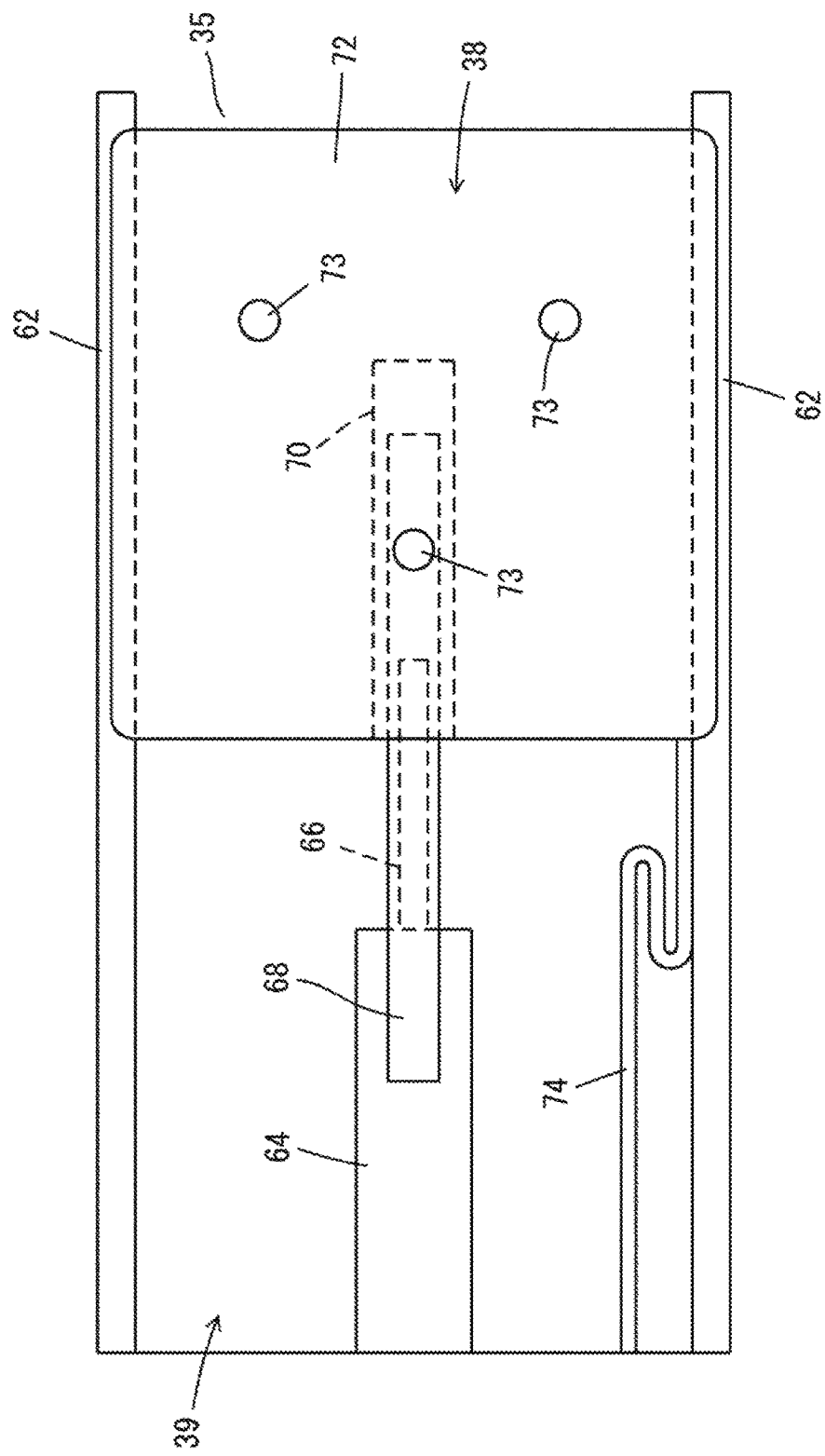
FIG. 5 is a plan view of a slide rack according to a preferred embodiment of the present invention.

FIG. 5 illustrates the slide rack 38. The slide rack 38 advances from and retreats to the fixed portion 39 along guides 62. The slide mechanism may be any slide mechanism. For example, a cylinder 64 that operates under gas pressure causes a middle portion 68 fixed to a piston 66 to advance and retreat. A double-speed mechanism (not illustrated) causes a top portion 70 to advance and retreat with a stroke twice that of the piston 66. A plate 72 is fixed to the top portion 70 to place a cassette thereon. Reference numeral 73 denotes coupling pins to guide and position the underside of a cassette. Reference numeral 74 denotes a cable guide for a sensor or the like (not illustrated) provided to the slide rack 38.

Figure 6:
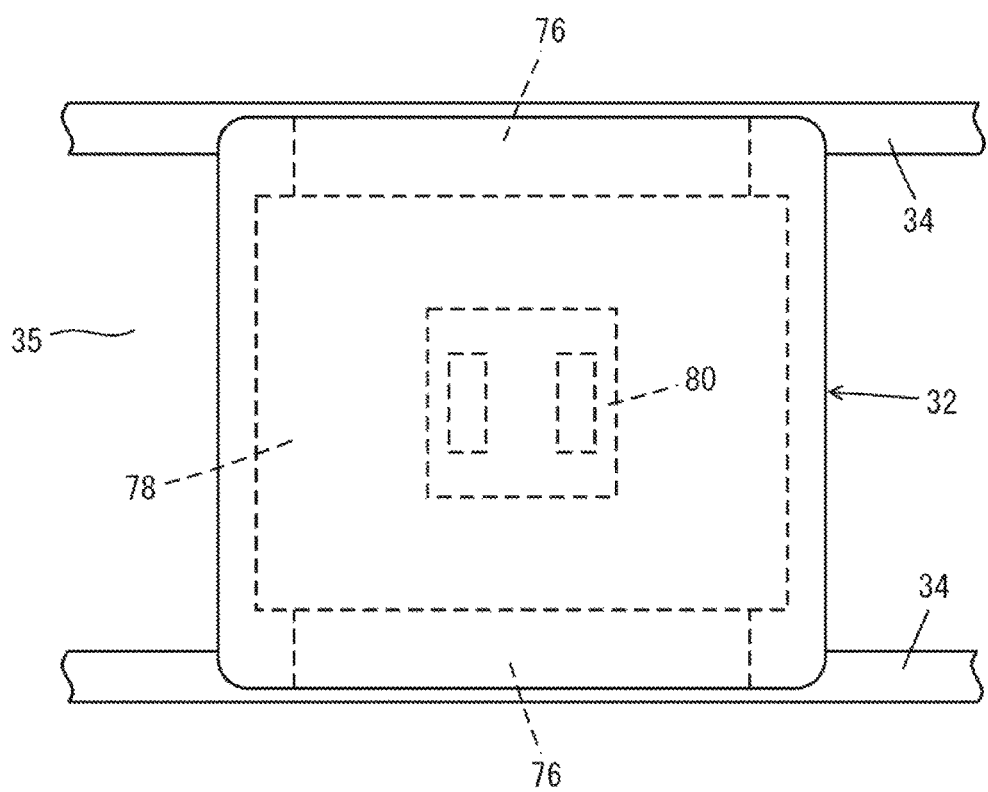
FIG. 6 is a plan view of a local carrier according to a preferred embodiment of the present invention.

FIG. 6 illustrates the local carrier 32, which includes a pair of travelling portions 76 and a lifting device 78, for example. By raising and lowering a lifting stage 80 having a chuck, a cassette is transferred between a load port and the racks 38 and 40.

Figure 7:
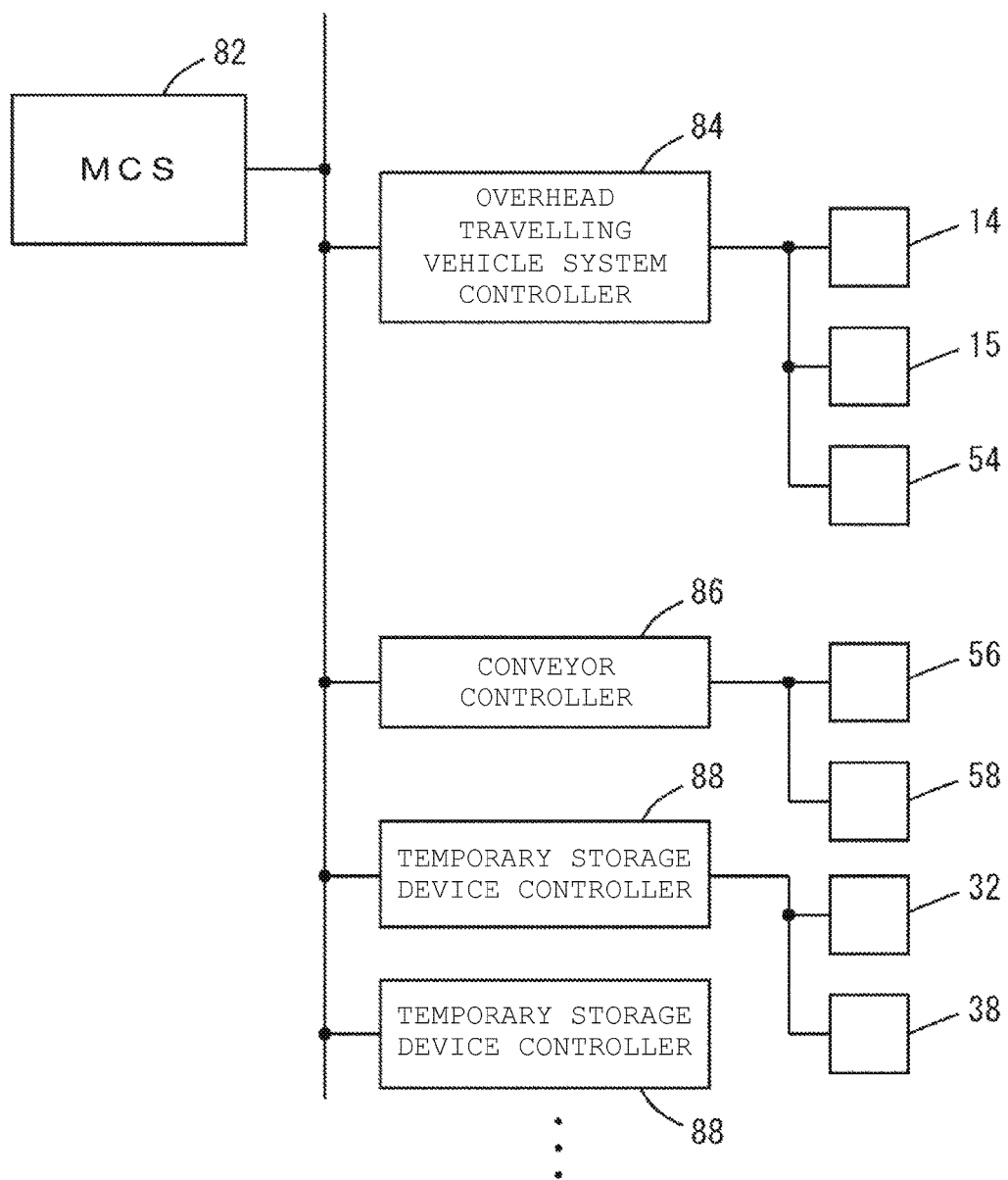
FIG. 7 is a block diagram illustrating a control system of the transport system in FIG. 4.
Figure 8:
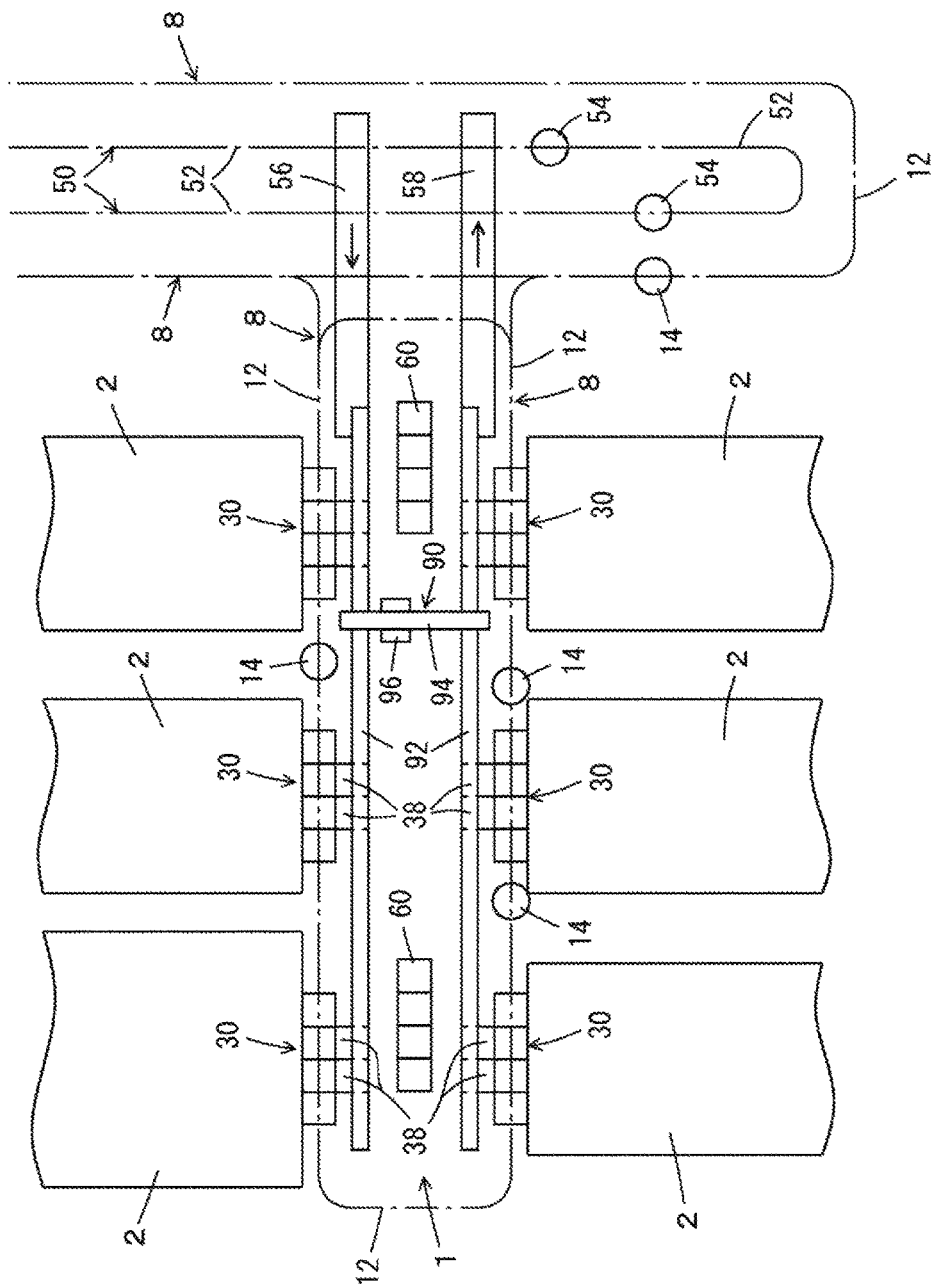
FIG. 8 is a plan view of a transport system according to an alternative preferred embodiment of the present invention.
Figure 9:
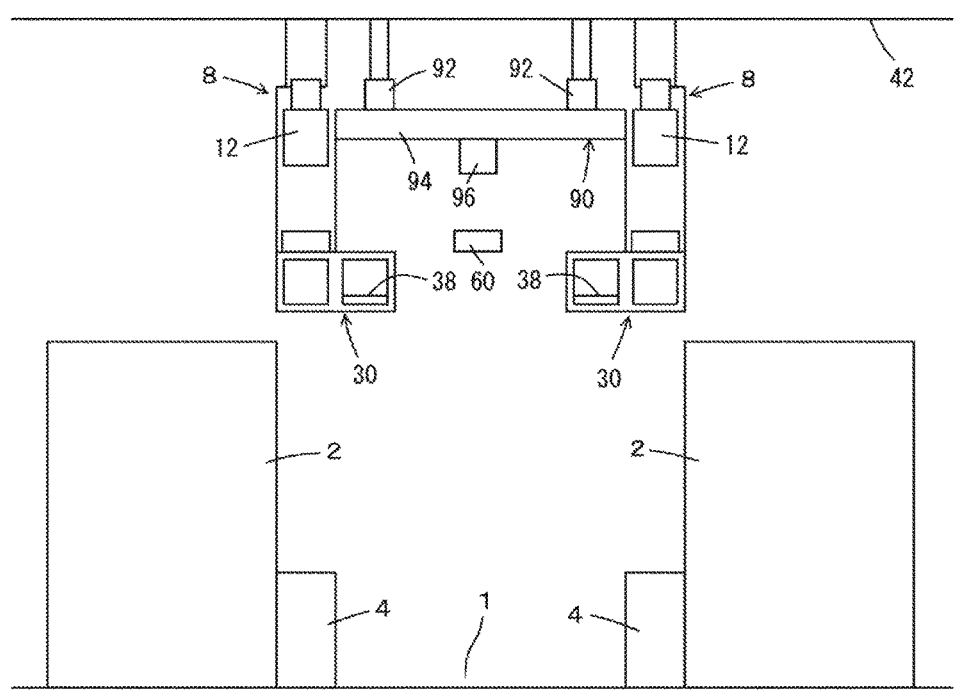
FIG. 9 is a front view of the transport system according to an alternative preferred embodiment of the present invention.

FIG. 7 illustrates a control system of the transport system. A transport control system (MCS: Material Control System) 82 controls transport of articles in the semiconductor factory. An overhead travelling vehicle system controller 84 controls the overhead travelling vehicles 14, 15, and 54. Alternatively, a separate controller may be provided for each overhead travelling vehicle system. A conveyor controller 86 controls the conveyors 56 and 58. A temporary storage device controller 88 controls the local carrier 32 and the slide rack 38 for each temporary storage device.

The operation and effect of the present preferred embodiment will be described.

1) The temporary storage device 30 allows the load port 4 and the overhead travelling vehicle systems 8 and 10 to be connected in a desired combination. Further, the slide rack 38 and the fixed rack 40 allow the cassettes 6 to be stored temporarily.

2) The conveyors 56 and 58 allow the second overhead travelling vehicle system 10 to be connected to the overhead travelling vehicle system 50 in the inter-bay route.

3) A cassette of a hot lot is able to be unloaded from the second overhead travelling vehicle system 10 via the slide rack 38 to the load port 4, and carried out from the load port 4 via the slide rack 38 to the second overhead travelling vehicle system 10.

In FIGS. 1 to 7, the second overhead travelling vehicle system 10 is preferably used, but this can be changed to a desired transport system capable of transferring the cassettes 6 to and from the slide racks 38 and the conveyors 56 and 58. Such alternative preferred embodiments are illustrated in FIGS. 8 to 13. The transport systems in FIGS. 8 to 13 are similar to the transport system in FIGS. 1 to 7 except for points otherwise specified. In the alternative preferred embodiment in FIGS. 8 and 9, a gantry crane 90 provided in a position higher than temporary storage devices 30 is preferably used. Reference numerals 92 and 92 denote rails of the gantry crane 90. A bridging portion 94 moves along the rails 92 in a bay 1. A hoist 96 moves along the bridging portion 94. The hoist 96 moves in the bay 1, and is able to transfer articles to and from slide racks 38, conveyors 56 and 58, and buffers 60 as desired.

Figure 10:
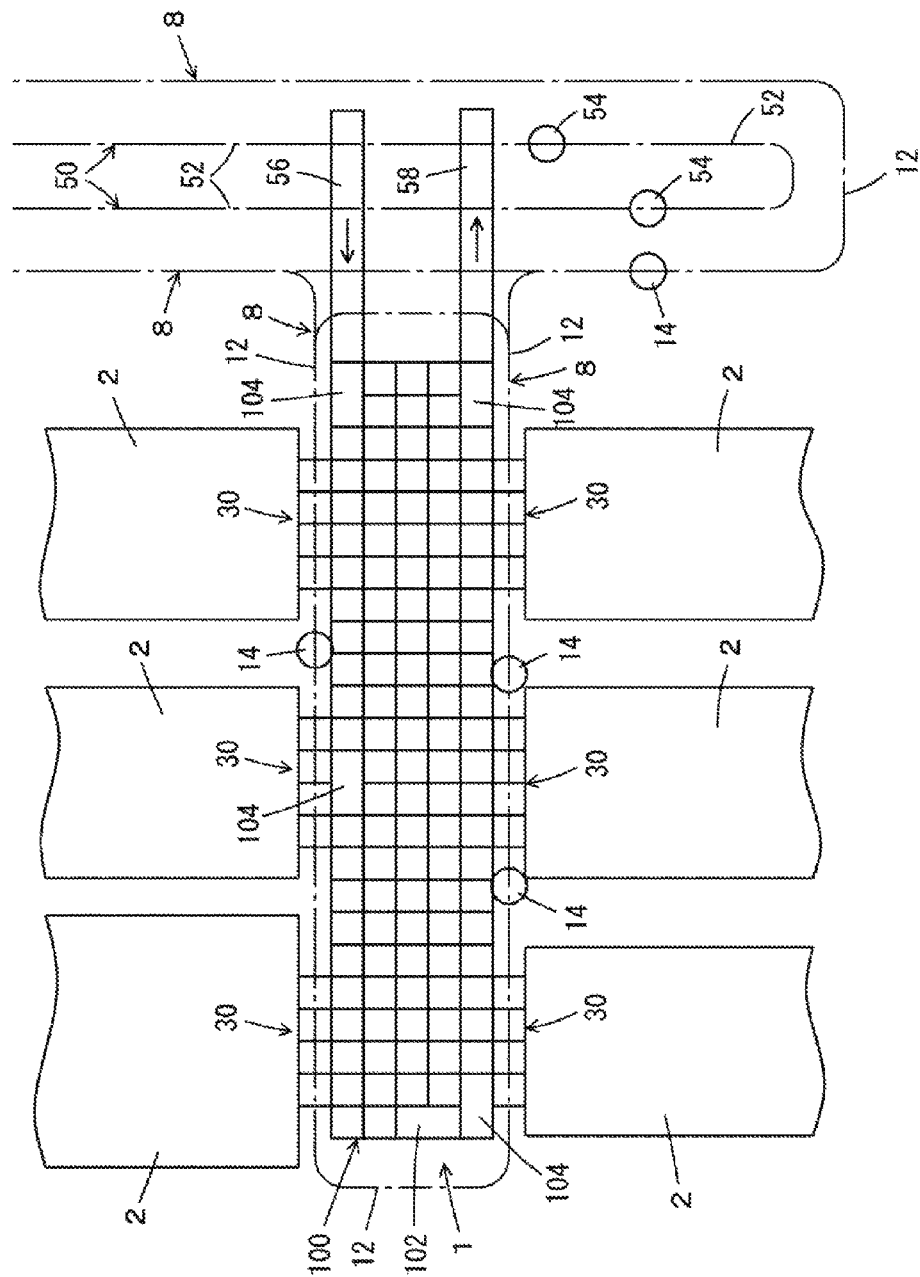
FIG. 10 a plan view of a transport system according to an alternative preferred embodiment of the present invention.
Figure 11:
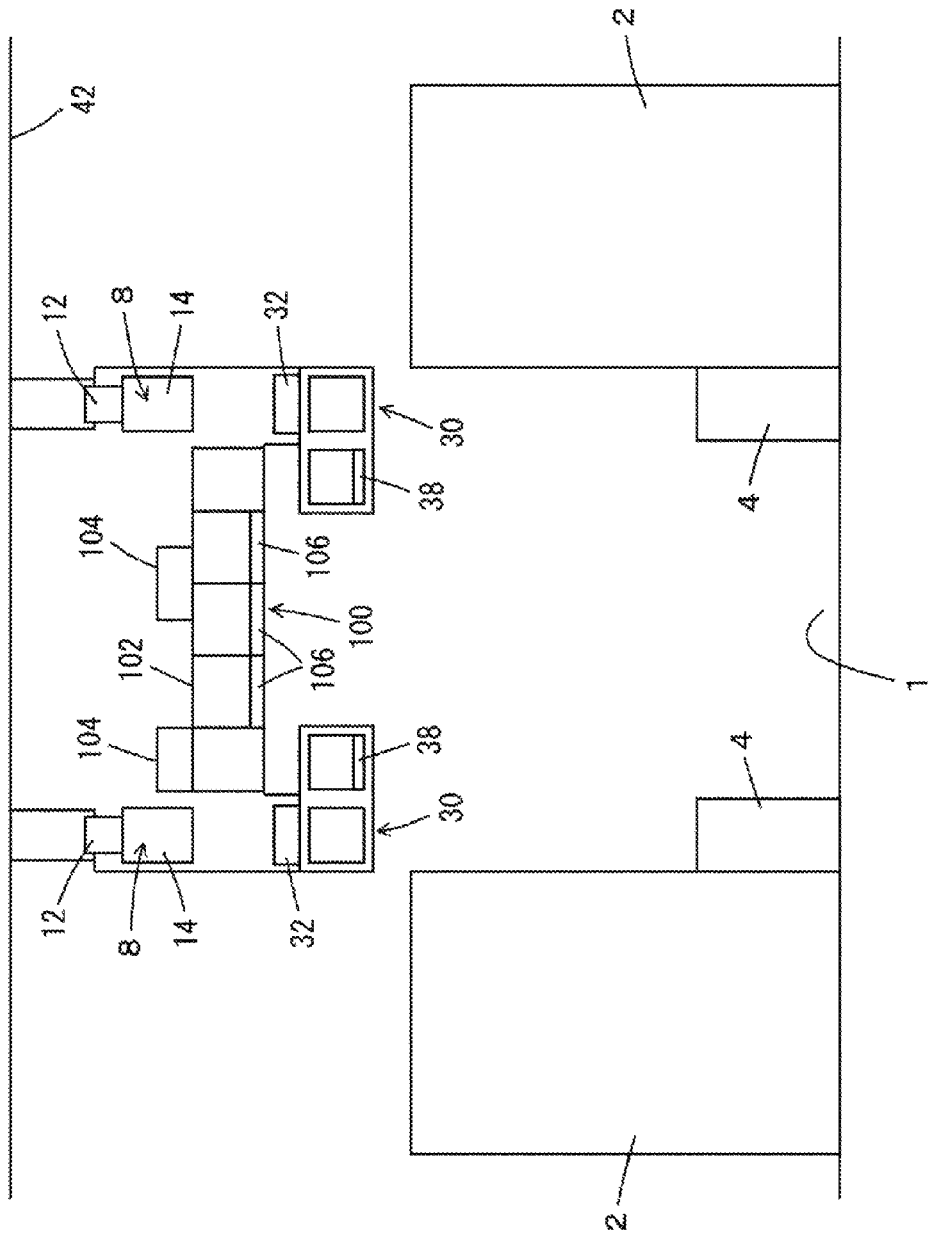
FIG. 11 is a front view of the transport system according to an alternative preferred embodiment of the present invention.

In the alternative preferred embodiment in FIGS. 10 and 11, a grid buffer system 100 provided in a position higher than temporary storage devices 30 is preferably used. Reference numeral 102 denotes grid-shaped rails of a combination of horizontal and vertical travel rails. Carriers 104 are able to horizontally and vertically travel on the grid-shaped travel rails 102 along the horizontal and vertical travel rails, and include a hoist to raise and lower a cassette. Above slide racks 38 and above conveyors 56 and 58, a cassette is raised and lowered to pass between the horizontal and vertical travel rails for transfer. In positions other than above the slide racks 38 and the conveyors 56 and 58, racks 106 are provided below the horizontal and vertical travel rails to temporarily store cassettes. The racks 106 may be omitted.

Figure 12:
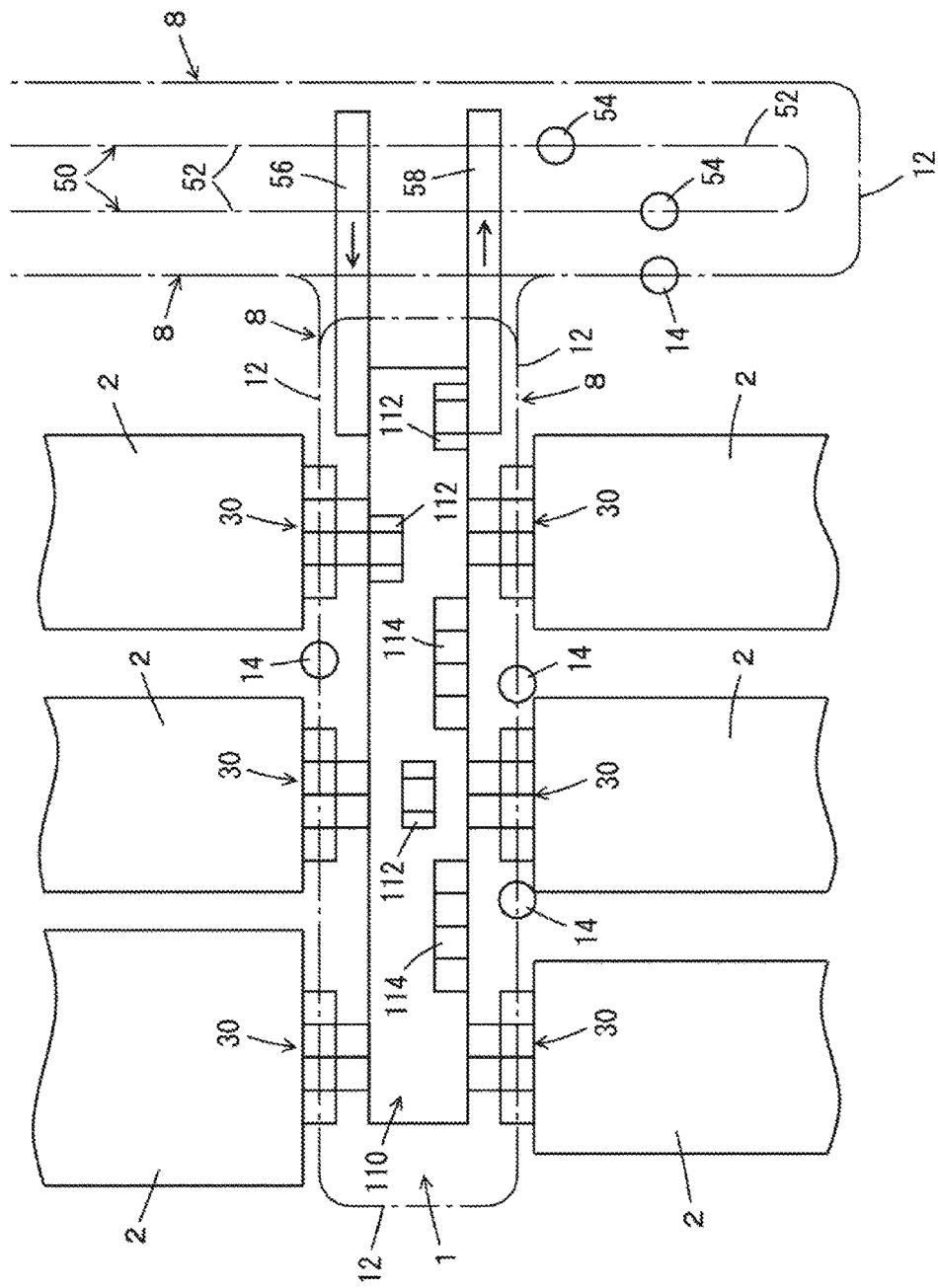
FIG. 12 a plan view of a transport system according to an alternative preferred embodiment of the present invention.
Figure 13:
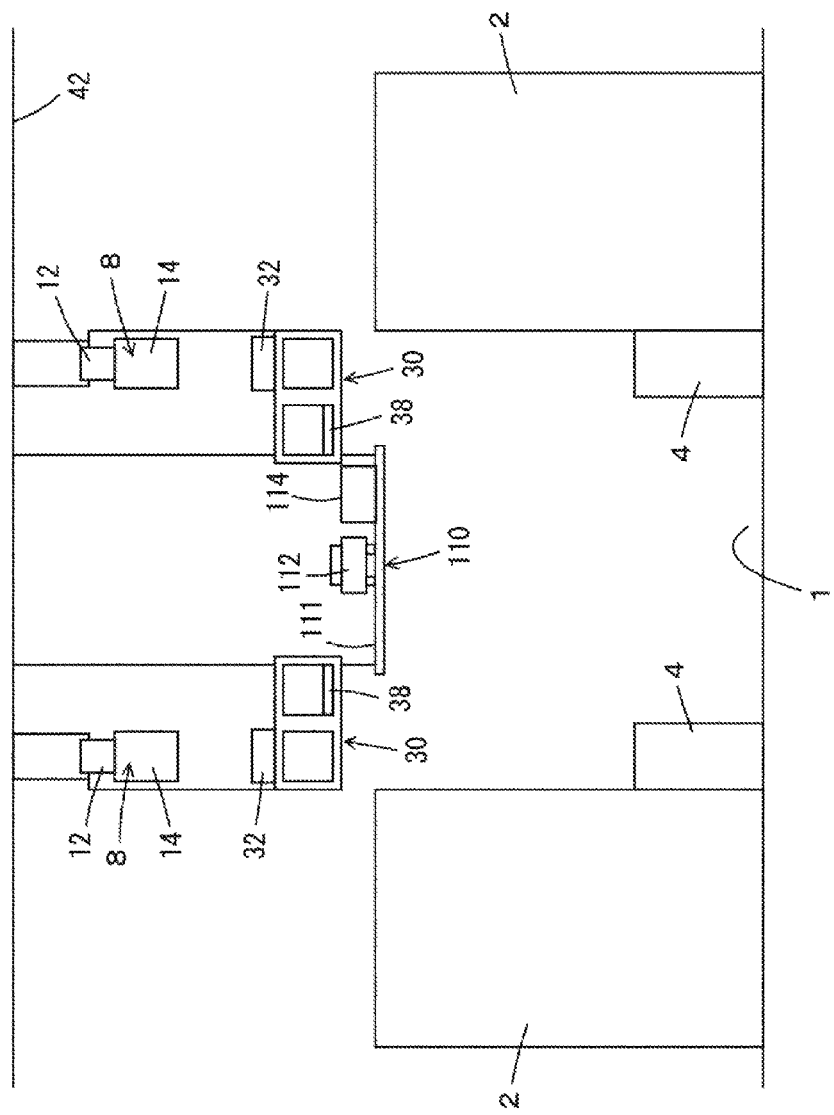
FIG. 13 is a front view of the transport system according to an alternative preferred embodiment of the present invention.

In the alternative preferred embodiment in FIGS. 12 and 13, an automatic guided vehicle system 110 provided in a position lower than temporary storage devices 30 is preferably used. A floor 111 of the automatic guided vehicle system 110 is provided with a number of holes in the form of a mesh or the like so as not to block the flow of clean air. Automatic guided vehicles 112 including a transfer device travel on the floor 111 to transport cassettes between slide racks 38 and conveyors 56 and 58. Reference numeral 114 denotes buffers of the automatic guided vehicle system 110. The buffers 114 are disposed at a height where the automatic guided vehicles 112 are able to transfer cassettes. The buffers 114 may be omitted.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A temporary storage device that temporarily stores an article between an overhead travelling vehicle system and an article transfer position, the temporary storage device comprising:
   a local carrier capable of travelling, the local carrier including a hoist to raise and lower an article;
   travel rails of the local carrier provided below a travel rail of the overhead travelling vehicle system so as to pass directly above the transfer position; and
   a slide rack provided below the travel rails of the local carrier, the slide rack being provided entirely below the local carrier, the slide rack being slidable between a portion directly above the transfer position and a second position in which an article is transferred to and from a second transport system including a transfer device, the second position being different from the portion directly above the transfer position in a direction perpendicular or substantially perpendicular to the travel rails of the local carrier in a horizontal plane.

2. A transport system comprising:
   the temporary storage device according to claim 1;
   a first overhead travelling vehicle system, which is the overhead travelling vehicle system, with a travel rail passing directly above the transfer position; and
   a second overhead travelling vehicle system, which is the second transport system, with a travel rail passing above the second position.

3. The transport system according to claim 2, wherein
   the transfer position is a load port of a processing device; and
   the second overhead travelling vehicle system transports an article with a production-control attribute different from that of the first overhead travelling vehicle system.

4. A transport system comprising:
   the temporary storage device according to claim 1 provided in a bay of a semiconductor factory;
   a first overhead travelling vehicle system, which is the overhead travelling vehicle system, with a travel rail passing directly above the transfer position, the travel rail extending from inside the bay to an inter-bay route for inter-bay transport;
   the second transport system being capable of transferring an article to and from the slide rack located in the second position and transporting an article in the bay;
   an overhead travelling vehicle system for inter-bay transport with a travel rail disposed in parallel or substantially in parallel with the travel rail of the first overhead travelling vehicle system in the inter-bay route; and
   a conveyor that connects a position below the overhead travelling vehicle system for inter-bay transport and the second transport system.

5. A temporary storage method for temporarily storing an article between an overhead travelling vehicle system and an article transfer position, the method performed by a temporary storage device including:
   a local carrier capable of travelling, the local carrier including a hoist to raise and lower an article;
   travel rails of the local carrier provided below a travel rail of the overhead travelling vehicle system so as to pass directly above the transfer position; and
   a slide rack provided below the travel rails of the local carrier, the slide rack being provided entirely below the local carrier, the slide rack being slidable between a portion directly above the transfer position and a second position in which an article is transferred to and from a second transport system including a transfer device, the second position being different from the portion directly above the transfer position in a direction perpendicular or substantially perpendicular to the travel rails of the local carrier in a horizontal plane;
   the method comprising the steps of:
   transferring an article by the local carrier between the transfer position and the slide rack;
   transferring an article between the slide rack located directly above the transfer position and the overhead travelling vehicle system; and
   transferring an article between the slide rack located in the second position and the second transport system.

6. The temporary storage device according to claim 1, wherein the slide rack is configured to receive and store an article transferred by the local carrier.

* * * * *